United States Patent [19]

Vatus et al.

[11] Patent Number: 4,742,026
[45] Date of Patent: May 3, 1988

[54] METHOD FOR THE SELECTIVE DRY ETCHING OF LAYERS OF III-V GROUP SEMICONDUCTIVE MATERIALS

[75] Inventors: Jean Vatus, Verrieres le Bouisson; Jean Chevrier, Gif sur Yvetie, both of France

[73] Assignee: Thomson-CSF, Paris, France

[21] Appl. No.: 42,819

[22] Filed: Apr. 27, 1987

[30] Foreign Application Priority Data

Apr. 30, 1986 [FR] France ................ 86 06329

[51] Int. Cl.$^4$ .......................... H01L 21/465
[52] U.S. Cl. ................... 437/245; 156/643; 156/650; 156/646; 156/662; 437/203; 357/22; 148/DIG. 131
[58] Field of Search ............... 437/245, 203; 156/643, 156/644, 646, 650, 651, 662; 148/DIG. 131, DIG. 51; 357/22 K

[56] References Cited

U.S. PATENT DOCUMENTS

| | | | |
|---|---|---|---|
| 4,326,911 | 4/1982 | Howard et al. | 156/643 |
| 4,457,820 | 7/1984 | Bergeron et al. | 156/643 |
| 4,484,978 | 11/1984 | Keyser | 156/643 |
| 4,603,420 | 7/1986 | Nishizawa et al. | 357/17 |
| 4,615,102 | 10/1986 | Suzuki et al. | 156/646 |

FOREIGN PATENT DOCUMENTS 0007936 1/1982 Japan.

OTHER PUBLICATIONS

Hikosaka et al., "Selective Dry Etching of Al-GaAs—GaAs Heterjunction," Jap. J. Appl. Phys. vol. 20, No. 11, Nov., 1981, pp. L845–L850.

Hipwood et al, "Dry Etching of Through Substrate Via Holes for GaAs MMIC's," J. Vac. Sci. Technology B, vol. 3, No. 1, Jan./Feb., 1985, pp. 395–397.

Hu et al., "RIE of GaAs and InP using $CCl_2F_2/Ar/O_2$", Appl. Phys. Lett., vol. 37, No. 11, Dec. 1, 1980, pp. 1022–1024.

*Primary Examiner*—Brian E. Hearn
*Assistant Examiner*—Mary A. Wilczewski
*Attorney, Agent, or Firm*—Oblon, Fisher, Spivak, McClelland & Maier

[57] ABSTRACT

The invention pertains to a method for the selective etching of a surface layer which is automatically stopped at a subjacent layer.

According to the invention, a first layer of a material containing gallium is selectively etched with respect to a second layer containing aluminium by reactive ion etching in the presence of a pure freon plasma $C Cl_2F_2$. At low pressures (0.5 to 2.5 pascals), the etching is anisotropic and makes it possible to etch the gate recess of a field effect transistor. At a higher pressure (6 to 10 pascals), the etching is isotropic and makes it possible to sub-etch the first layer.

Application to the manufacture of field effect transistors made of group III-V materials, with low access resistances.

3 Claims, 2 Drawing Sheets

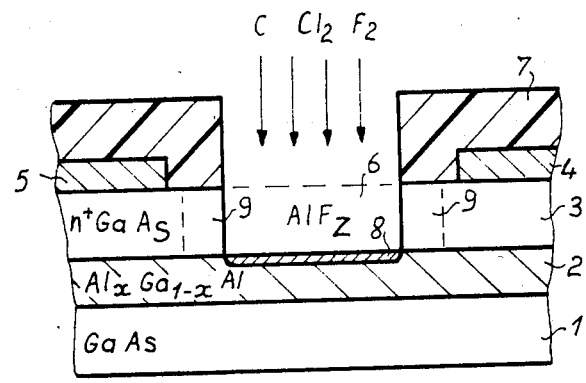
FIG_1
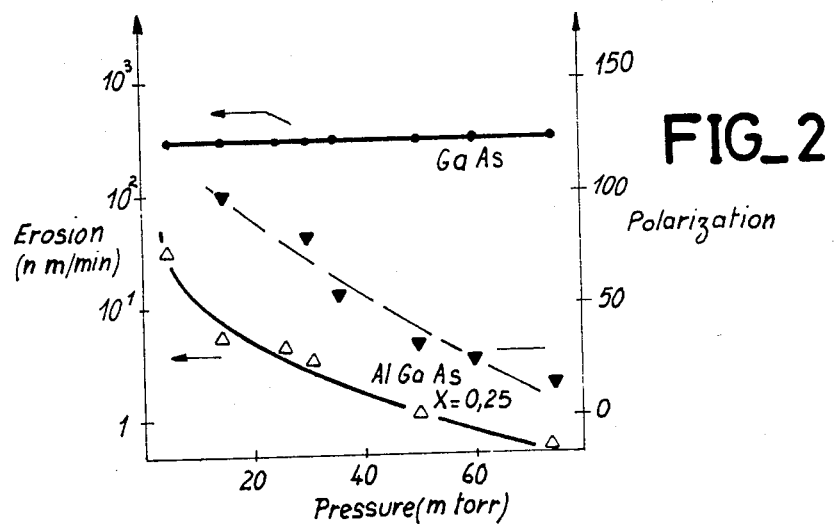
FIG_2
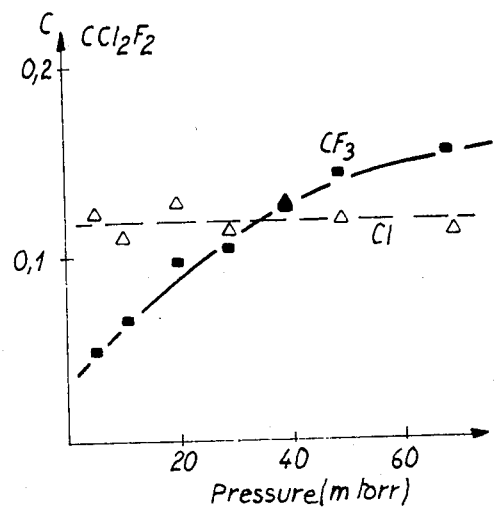
FIG_3

FIG_4
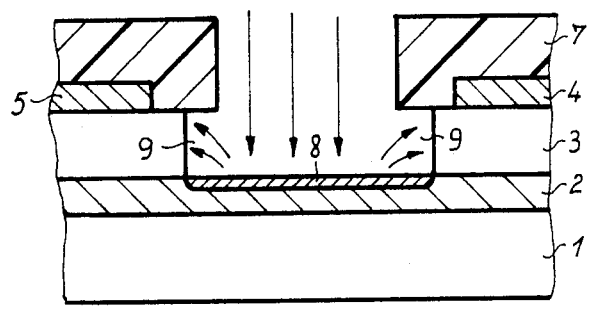
FIG_5
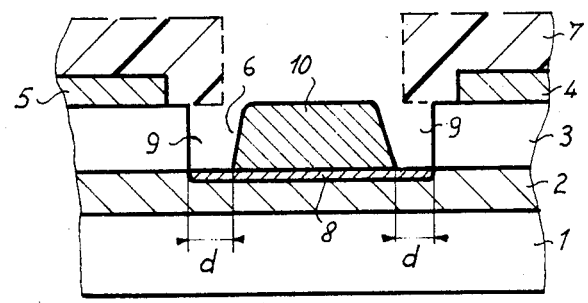

METHOD FOR THE SELECTIVE DRY ETCHING OF LAYERS OF III-V GROUP SEMICONDUCTIVE MATERIALS

BACKGROUND OF THE INVENTION

Field of the Invention

The present invention pertains to a method for the selective dry etching of a first semi-conductive compound, which contains no aluminium molecules, without the attacking of a second semi-conductive compound comprising an aluminium molecule in its formula. This method is applied to the hollowing out of the recess in which is deposited the gate metallization of a transistor of the field effect type, made with materials of the III-V group, one of which has aluminum in its formula. The invention also pertains to the transistor made by this method.

It is known that the access or contact resistances between the (source, drain and gate) electrodes of a transistor and the active layer of this transistor plays a major role in determining the electrical characteristics of the transistor. This is why the source and drain metallizations are deposited on a layer of material which is a good conductor. But this layer must be hollowed out, between the source and the drain, if the gate metallization is to be as close as possible to the active layer of the transistor: thus, a depression is formed, generally known as a recess, between the source and the drain. The etching of the recess can be done according to wet or dry methods, but it must stop at the active layer.

The invention therefore, pertains to a method of dry, reactive, ion etching which is anisotropic and which is highly selective between two materials deposited on one support and stacked, of which one material, the one which is in contact with the support, comprises aluminum in a range of 10% to 40% while the other material, the one which is at the surface of the stack, contains no aluminum. To make the description clearer, the invention will be explained on the basis of an example of a transistor, the active layer of which is made of AlGaAs-$Al_xGa_{l-x}As$ more exactly, and the layer of contact between the source and the drain is made of GaAs, although the invention more generally pertains to pairs of materials of the group III-V, only one of which has aluminum. According to the invention, the layer of GaAs is selectively etched by reactive ion etching using a freon plasma with the formula $CCl_2F_2$. In the plasma formed, the chlorine ions act with the gallium from the GaAs to give a compound of the $GaCl_y$ type which is volatile towards 100° C., while the fluorine ions act with the aluminum from AlGaAS to give a compound of the $AlF_z$ type which is not volatile before about 1300° and which, therefore, remains at the surface of the layer of AlGaAs, protecting it from attack at the etching temperature which must be less than about 130° C. to be compatible with the masking resins. The pressure conditions of the plasma can be used to control the anisotropism of the etching and, especially, to make a sub-etching of the layer under the resin layer which protects it.

SUMMARY OF THE INVENTION

More precisely, the invention pertains to a method for the dry etching of layers of semi-conductive materials of the III-V group, the etching being selective between a first layer, containing gallium and partially protected by a mask of resin, and a second layer containing aluminium in a proportion of 10 to 40%, the first layer alone having to be etched by this method which is done by reactive ion etching using a pure freon plasma $CCl_2F_2$ in two stages:

In a first stage of anisotropic etching, the first layer is etched up to the interface with the second layer, with the pure freon plasma being at a pressure ranging between 0.5 and 2.5 pascals, at a flowrate of 2 cm$^3$/min and a polarization voltage for the cathode of the reactive ion etching device that ranges from $-50$ to $-130$ V, under power of 1 W/cm$^2$, In a second stage of isotropic etching, the first layer is sub-etched, under the resin mask, by increasing the pressure of pure freon plasma to within a range of 6 to 10 pascals at a flowrate of 2 cm$^3$/min, the electrical conditions being the same as in the first stage.

The invention also pertains to a transistor made according to the method laid down, a transistor comprising, under the gate metallization, a fine layer of aluminium and fluorine compound with the formula $AlF_z$.

BRIEF DESCRIPTION OF THE DRAWINGS

The invention will be better understood from the following detailed description of the reactive ion etching method, applied to the making of a field effect transistor, this description being made with reference to the appended drawings which all refer to the invention. Of these figures, FIG. 1 is a highly simplified cross-section view of the surface region of a transistor in which a layer of GaAs must be selectively etched, FIG. 2 is a curve showing the speed of erosion of GaAs and AlGaAs as a function of the pressure of plasma, FIG. 3 is a curve showing the $CF_3$ and Cl concentrations in the plasma as a function of the plasma pressure, FIG. 4 is a cross-section view of the surface region of a transistor after the sub-etching stage of the surface layer of GaAs, FIG. 5 is a cross-section of the gate region of a transistor, the recess of which has been engraved by the method of the invention.

DETAILED DESCRIPTION

FIG. 1 is a highly simplified cross-sectional view of the surface region of a GaAs/AlGaAs heterojunction transistor. In this figure, the transistor has not yet received its gate metallization. This figure will be used to explain the problem to be resolved as well as the method of the invention.

A heterojunction transistor comprises a support 1 which does not need to be described in detail because the various layers that comprise this support, such as the GaAs semi-insulating substrate and one or more layers of smoothing materials for example, are outside the field with which the invention is concerned. This transistor further comprises at least one active layer 2, made of a material such as $Al_xGa_{l-x}As$, which is at the surface of the transistor, i.e. it is this layer that receives the gate metallization. Finally, the source and drain contacts are made through a highly doped n+ type GaAs layer 3, so as to reduce the source and drain resistances $R_S$ and $R_D$ between the respective metallizations 4 and 5 and the active layer 2. The method for making the layer 3, whichever it may be, gives a united layer, and it is therefore necessary to hollow out a recess 5 in the layer 3 so as to firstly separate the highly conductive layer 3 of n+GaAs into two islands without any contact between them, and secondly, to come nearer to the gate metallization of the active layer or, depending on the type of transistor made, to control the gate metallization so as to control the threshold voltage.

This result is obtained in a known manner by depositing, on the layer 3 of n+GaAs, two source and drain metallizations 4 and 5 and then a layer 7 of photosensitive resin or electrosensitive resin, and to open a window in the resin layer 7 so that the recess 6 can be hollowed out by a suitable method.

After the recess 6 is hollowed out, the mask of resin 7 is also used to deposit the gate metallization, not depicted in FIG. 1, by self-alignment on the edges of the mask.

The method according to the invention concerns precisely a method of reactive ion etching which can be used to hollow out a recess 6 in a surface layer of a material comprising gallium in particular, without attacking and without damaging the surface of a subjacent layer of a material containing aluminum in particular, in a quantity ranging from 10% to 40%, with the aluminum present in a material as an impurity playing no part in the method.

According to this method, the recess 6 is hollowed out by means of a pure freon plasma with the formula $CCl_2F_2$. The circular washer out of which is made the batches of transistors, in which the recesses have to be engraved, is introduced into a reactive ion etching device, between two electrodes which are polarized between $-30$ V and $-250$ V at the cathode which supports this semiconductive circular blank. The plasma of $CCl_2F_2$ is at high frequency, at 13.56 Mhz. The temperature in the instrument is maintained at below 130° C. and is in any case compatible with the nature of the mask 7 depending on whether it is made of resin or mineral materials such as silicon or silicon nitride.

In a reactive ion etching, there is a double effect: firstly, a physical etching by the ions which strike the surface of the layer to be etched and, secondly, a chemical etching. In a pure freon plasma, the $CCl_2F_2$ molecule is split up into a large number of ions of greatly varying natures, especially the chlorine ions which chemically attack the layer 3 of GaAs, giving gallium chloride of the form $GaCl_x$ which is volatile at about 100° C., i.e. volatile under the temperature conditions of the method. The chemical analysis of the ions and molecules produced during the reaction, done by mass spectrometry and optical emission spectrometry, has shown that gallium chloride and arsenic are both present in gaseous form and that the layer 3 of n+GaAs is removed at the end of the attacking process by active ion engraving.

By contrast, when the fluorine ions produced in the plasma by the splitting up of the freon molecule come into contact with the layer 2 of GaAlAs, they give an aluminum fluoride with a general formula $AlF_y$, which is volatile only at temperatures in the region of 1300° C. Consequently, the aluminum fluoride layer 8 formed on the surface of the active layer 2 AlGaAs is solid, stable and, on a thickness of several electron shells, it protects the AlGaAs and inhibits the continuation of the attack.

In FIG. 1, two lines drawn with dashes determine the sub-etching spaces 9 of the GaAs layer 3: this sub-etching at 9 will be explained with reference to FIG. 4. It corresponds to a second stage in the reactive ion etching method of the invention.

For the pair of materials $GaAs/Al_xGa_{1-x}As$, with x equal to about 0.25, i.e. $Al_{0.25}Ga_{0.75}As$ in which Al is at a concentration of 20.5%, the method of the invention gives an etching selectivity ratio of more than 1000, and the etching is clean and anisotropic. This result can be obtained by adjusting the pressure of the gas which produces the plasma.

This point is brought out in FIGS. 2 and 3. FIG. 2 gives the speed of erosion, in nm per minute, for GaAs and for AlGaAs, as a function of the pressure, expressed on the x-axis in millitorrs, it being known that 1 torr = $1.33 \times 10^2$ pascals. Within a range of about 10 to 80 millitorrs, i.e. 1.3 to 10.4 pascals, and with a constant flowrate of pure freon $CCl_2F_2$, the erosion rate of GaAs does not vary while the erosion rate of AlGaAs decreases rapidly with the increase in the gas pressure. This effect is in relation with the ratio of $Cl/CF_3$ in the plasma which decreases when the gas pressure increases, as can be seen in FIG. 3 which shows the pressure on the x-axis and the concentration of ions Cl and $CF_3$ on the y-axis. The increase in the $CF_3$ concentration and the really low rate of erosion for AlGaAs in a plasma of $CCl_2F_2$ is in relation with the formation of the non-volatile compound $AlF_z$, the most current form of which is $AlF_3$ which has a high sublimation level.

Thus, to control the attack of a layer of GaAs by a pure freon plasma $CCl_2F_2$, it is possible to:

Increase the gas pressure, and take it from 0.5 to about 10 pascals,

Reduce the flowrate of freon introduced in the reactive ion etching device so as to increase the resident time of an ion in the plasma. The flowrate used varies from 20 cm$^3$/min to 0.5 cm$^3$/min, measured under standard conditions, between the beginning and the end of the ion etching, or more precisely, between the first and second stages of ion etching, Increase the electrical power applied to the two polarizing plates in the ion etching device without doing so excessively, so as to avoid the physical bombardment of the substrate by ions. This is why, according to the method, the polarization of the cathode is maintained between $-30$ V and about $-130$ V as can be seen in the broken-line curve shown in FIG. 2, Play on the volume of plasma or the inter-electrode distance.

In fact, the polarization voltage and the inter-electrode distance are chosen in such a way that they favour chemical etching rather than physical etching by ion bombardment.

The ions formed in the pure freon plasma are accelerated perpendicularly to the plane of the anode and the cathode in the reactive ion etching device. Consequently, they give ion beams which are parallel to one another and provide perfectly anisotropic etching as depicted in FIG. 1: the etched sides of the GaAs layer 3 are perfectly perpendicular to the main plane of this layer. This is valid for a range of pressure of about 10 to 20 millitorrs, i.e. 1.3 to 2.6 pascals. For greater pure freon pressures, such as 50 millitorrs or 6.5 pascals, the selectivity between the two materials becomes greater, and a sub-etching of the surface layer of GaAs, under the mask 7, can be observed. In other words, the etching becomes less anisotropic when the pressure increases, following a rebounding of ions on the unoccupied surface of AlGaAs which causes them to attack the layer of GaAs sideways. This effect can be applied to the defintion of the gate recess in the manufacturing of a transistor and to the insulation of the gate metallization with reference to the n+GaAs contact layer 3.

This is what is shown in FIG. 4 which corresponds to the second stage of the method, during which the pressure has been increased from 0.5 to about 10 pascals while the gas flowrate may be decreased from 2 to 0.5 cm$^3$/min.

FIG. 5 depicts the surface region of a transistor manufactured by using the method of the invention to hollow out the recess of the gate metallization. This figure repeats the resin mask 7 with a broken line: this is the same mask as the one used in FIGS. 1 and 4 for the two ion etching operations. It is ussed for the self-alignment of the gate metallization 10 by evaporation of metal. Owing to the fact that the contact layer 3 has been etched beneath the resin layer 7, there is a slight distance "d" between the edges of the metallization 10 and the edges of the contact layers 3; this distance prevents a short circuit between the gate metallization 10 and the conductive layers 3. This distance "d" can be controlled by several parameters such as the gas pressure during the reactive ion etching and the duration of the operation.

Of course, when the gate metallization 10 is being deposited, the evaporated metal is also deposited on the mask 7 although this layer is not depicted in FIG. 5. At the end of this metallizing operation, the mask 7 and the layer of metal which it supports are removed by an operation, known as lift-off, in which the resin is dissolved and the field effect transistor is completed.

This field effect transistor has a fine layer 8 of aluminium fluoride which is at the surface of its active layer 2 and in contact with the gate metallization 10. This fine layer of aluminium fluoride has a thickness of a few electron shells, and its electrical behaviour exhibits characteristics close to those of a Schottky contact.

The method according to the invention can be applied with a conventional reactive ion etching machine which is available in the market. This machine is first cleaned by making a vacuum of 10$^{-6}$ torrs in the chamber before pure freon is introduced. In order to perform the reactive ion etching process of the invention efficienty, this machine must have a power of about 0.8 W/cm$^2$ and means by which to control the flowrate of pure freon CCl$_2$F$_2$ within a range of about 2 cm$^3$/min. This reactive ion etching machine has connected to it, firstly, a mass spectrometer to analyze the molecules given by the plasma and a monochromator working within the range 200 to 600 nanometers, these two means being used in parallel to identify the molecules given.

The invention has been explained with reference to the example of the manufacture of a field effect transistor comprising a layer of GaAs on the surface and an underlying layer of AlGaAs. Of course, the invention applies to products other than transistors, such as light-emitting diodes or lasers and to other materials than the pair referred to. More generally, the surface layer must have an atom such as gallium that gives a volatile compound with chloride and the formula of the subjacent layer must have an aluminum atom giving a non-volatile compound with fluoride at the temperature at which the reactive ion etching is done. More generally, therefore, the method can be used for selective etching between the ternary and quaternary compounds of the III-V group, provided that one of the two compounds, the one which is not attacked, comprises aluminum.

What is claimed is:

1. Method for the dry etching of layers of semiconductive materials of the III-V group, the etching being selective between a first layer, containing gallium and partially protected by a mask of resin, and a second layer containing aluminum in a proportion of 10 to 40%, the first layer alone having to be etched by this method comprising a reactive ion etching operation using a pure freon plasma CCl$_2$F$_2$ in two stages:
   in a first stage of anisotropic etching, the first layer is etched up to the interface with the second layer, with the pure freon plasma being at a pressure ranging between 0.5 to 2.5 pascals, at a flowrate of 2 cm$^3$/min and a polarization volate for the cathode of the reactive ion etching device that ranges from $-50$ to $-130$ V, under power of 1 W/cm$^2$,
   in a second stage of isotropic etching, the first layer is sub-etched, under the resin mask, by increasing the pressure of pure freon plasma to within a range of 6 to 10 pascals at a flowrate of 2 cm$^3$/min, the electrical conditions being the same as at the first stage.

2. Selective dry etching method according to claim 1, wherein the first layer is made of GaAs or of an alloy of the group III-V containing gallium and wherein the second layer is made of Al$_x$Ga$_{l-x}$As(x≃0.25) or an alloy of the group III-V containing aluminum.

3. Selective dry etching method according to the claim 1, wherein a surface layer of AlF$_z$, with a thickness of a few electron shells, lines the second layer of semiconductive material, the said surface layer inhibiting the etching of the second layer of semiconductive material.

* * * * *